United States Patent
Nakagawa

(10) Patent No.: US 10,222,212 B2
(45) Date of Patent: Mar. 5, 2019

(54) VIBRATOR ELEMENT, VIBRATOR, GYRO SENSOR, ELECTRONIC APPARATUS, AND MOVING OBJECT

(71) Applicant: Seiko Epson Corporation, Tokyo (JP)

(72) Inventor: Keiji Nakagawa, Minowa (JP)

(73) Assignee: Seiko Epson Corporation (JP)

( * ) Notice: Subject to any disclaimer, the term of this patent is extended or adjusted under 35 U.S.C. 154(b) by 198 days.

(21) Appl. No.: 15/083,376

(22) Filed: Mar. 29, 2016

(65) Prior Publication Data

US 2016/0290802 A1 Oct. 6, 2016

(30) Foreign Application Priority Data

Apr. 2, 2015 (JP) ................................. 2015-076035

(51) Int. Cl.
*G01C 19/5607* (2012.01)
*H03H 9/215* (2006.01)
*H03H 9/05* (2006.01)

(52) U.S. Cl.
CPC ....... *G01C 19/5607* (2013.01); *H03H 9/0542* (2013.01); *H03H 9/0547* (2013.01); *H03H 9/215* (2013.01)

(58) Field of Classification Search
CPC ............. G01C 19/5607; H03H 9/0542; H03H 9/0547; H03H 9/215; H03H 9/21; H03H 9/2484; H03H 9/2473; H03H 9/2494
See application file for complete search history.

(56) References Cited

U.S. PATENT DOCUMENTS

| 7,015,630 | B2 * | 3/2006 | Tanaya | H03H 9/1021 |
| | | | | 310/370 |
| 7,932,664 | B2 * | 4/2011 | Yamazaki | H03H 9/215 |
| | | | | 310/370 |
| 8,460,561 | B2 * | 6/2013 | Katoh | H03H 3/02 |
| | | | | 216/2 |
| 2004/0085163 | A1 * | 5/2004 | Kikushima | G01C 19/5607 |
| | | | | 333/200 |
| 2005/0040737 | A1 * | 2/2005 | Tanaya | H03H 9/1021 |
| | | | | 310/370 |
| 2007/0120449 | A1 * | 5/2007 | Aizawa | G01C 19/5621 |
| | | | | 310/370 |
| 2007/0159029 | A1 * | 7/2007 | Aratake | H03H 3/02 |
| | | | | 310/370 |
| 2008/0054763 | A1 * | 3/2008 | Kizaki | H03H 3/04 |
| | | | | 310/370 |

(Continued)

FOREIGN PATENT DOCUMENTS

| JP | 2006-017569 A | 1/2006 |
| JP | 2010-226639 A | 10/2010 |
| JP | 2012-231209 A | 11/2012 |

OTHER PUBLICATIONS

Translation of JP 2010-226639.*

*Primary Examiner* — Helen C Kwok
(74) *Attorney, Agent, or Firm* — Harness, Dickey & Pierce, P.L.C.

(57) ABSTRACT

A vibrator element includes a drive arm. The drive arm includes an upper surface, a lower surface, a groove opened to the upper surface, and a groove opened to the lower surface. The upper surface is disposed to be deviated by L1 on a +X axis side from the lower surface. The groove is disposed to be deviated by L2 on the +X axis side from the groove. L1 and L2 satisfy a relation of L2/L1>0.

16 Claims, 14 Drawing Sheets

(56) References Cited

U.S. PATENT DOCUMENTS

| | | | |
|---|---|---|---|
| 2009/0115294 A1* | 5/2009 | Kikushima | H01L 41/04 310/370 |
| 2010/0084948 A1* | 4/2010 | Katoh | G01C 19/5607 310/367 |
| 2010/0200543 A1* | 8/2010 | Katoh | H03H 3/02 216/41 |
| 2011/0115342 A1* | 5/2011 | Yang | H03H 9/215 310/365 |
| 2012/0007685 A1* | 1/2012 | Yamada | H03H 9/02102 331/156 |
| 2013/0076211 A1* | 3/2013 | Arimatsu | G04R 20/10 310/370 |
| 2013/0162110 A1* | 6/2013 | Lee | H01L 41/04 310/370 |
| 2014/0078870 A1* | 3/2014 | Kobayashi | H03H 9/1021 368/47 |
| 2015/0040664 A1* | 2/2015 | Ishii | G01C 19/5607 73/504.16 |
| 2015/0222245 A1* | 8/2015 | Ichikawa | H03H 9/215 310/370 |
| 2016/0087190 A1* | 3/2016 | Ishii | H03H 9/21 310/317 |
| 2016/0126923 A1* | 5/2016 | Nakagawa | H03H 9/21 310/370 |
| 2016/0282117 A1* | 9/2016 | Nakagawa | G01C 19/5607 |
| 2016/0282118 A1* | 9/2016 | Nakagawa | G01C 19/5607 |

* cited by examiner

VIBRATOR ELEMENT, VIBRATOR, GYRO SENSOR, ELECTRONIC APPARATUS, AND MOVING OBJECT

BACKGROUND

1. Technical Field

The present invention relates to a vibrator element, a vibrator, an electronic apparatus, and a moving object.

2. Related Art

In the related art, a vibrator element disclosed in JP-A-2010-226639 is known.

In the vibrator element disclosed in JP-A-2010-226639, the appearance shape of the vibrator element is obtained by patterning a quartz crystal substrate using a photolithographic method or an etching method. Specifically, the appearance shape of a gyro element can be obtained by forming resist masks corresponding to the appearance shape on the upper surface and the lower surface of a quartz crystal substrate and performing wet etching on the quartz crystal substrate from both surfaces via the resist masks. However, in such a method, the upper and lower masks are deviated in some cases. Therefore, there is a problem that the cross-sectional shapes of vibration arms are deviated from designed shapes due to the deviation in the masks. Further, it is difficult to avoid this problem in terms of precision of a device.

In the vibrator element in which the mask deviation occurs, the cross-sectional shapes are distorted to be coupled with in-plane vibration, and thus vibration occurs even out of a plane. When such out-of-plane vibration occurs, vibration leakage or noise occurs and vibration characteristics deteriorate.

SUMMARY

An advantage of some aspects of the invention is to provide a vibrator element, a vibrator, an electronic apparatus, and a moving object reducing coupling of out-of-plane vibration and having excellent vibration characteristics.

The invention can be implemented as the following forms or application examples.

Application Example 1

A vibrator element according to this application example includes: a base portion; and a vibration arm that is connected to the base portion and performs flexural vibration in a first direction included in an in-plane direction of the base portion. The vibration arm includes a first main surface, a second main surface having a front and rear relation with the first main surface, a first groove opened to the first main surface, and a second groove opened to the second main surface. The first main surface is disposed to be deviated on one side of the first direction from the second main surface. The first groove is disposed to be deviated on the one side of the first direction from the second groove. When L1 is a deviation quantity in the first direction at a center of the first main surface in the first direction from a center of the second main surface in the first direction and when L2 is a deviation quantity in the first direction at a center of an opening of the first groove in the first direction from a center of an opening of the second groove in the first direction, a relation of L2/L1>0 is satisfied.

With this configuration, it is possible to provide the vibrator element reducing coupling of out-of-plane vibration and having excellent vibration characteristics.

Application Example 2

In the vibrator element according to the application example, it is preferable that the first groove is disposed to be inclined in a thickness direction of the base portion so that the opening is deviated on the one side of the first direction from a bottom surface, and the second groove is disposed to be inclined in the thickness direction of the base portion so that a bottom surface is deviated on the one side of the first direction from the opening.

With this configuration, it is possible to reduce the coupling of the out-of-plane vibration more efficiently.

Application Example 3

A vibrator element according to this application example includes: a base portion; and a vibration arm that is connected to the base portion and performs flexural vibration in a first direction included in an in-plane direction of the base portion. The vibration arm includes a first main surface, a second main surface having a front and rear relation with the first main surface, and a groove opened to the first main surface. The first main surface is disposed on one side of the first direction to be deviated from the second main surface. The groove is disposed to be inclined in a thickness direction of the base portion so that an opening of the groove is deviated on the one side of the first direction from a bottom surface. When L1 is a deviation quantity in the first direction at a center of the first main surface in the first direction from a center of the second main surface in the first direction and when a region intersecting the second main surface by virtually extending the groove in a depth direction is a virtual opening and L2 is a deviation quantity in the first direction at a center of the opening of the groove in the first direction from a center of the virtual opening in the first direction, a relation of L2/L1>0 is satisfied.

With this configuration, it is possible to provide the vibrator element reducing coupling of out-of-plane vibration and having excellent vibration characteristics.

Application Example 4

In the vibrator element according to the application example, it is preferable that a relation of L2/L1>2 is satisfied.

With this configuration, it is possible to reduce the coupling of the out-of-plane vibration more efficiently.

Application Example 5

In the vibrator element according to the application example, it is preferable that a relation of L2/L1<4 is satisfied.

With this configuration, it is possible to reduce the coupling of the out-of-plane vibration more efficiently.

Application Example 6

In the vibrator element according to the application example, it is preferable that the vibrator element is an angular velocity detection element that detects an angular velocity.

With this configuration, convenience of the vibrator element is improved.

Application Example 7

A gyro sensor according to this application example includes: the angular velocity detection element according to the application example and a drive circuit that performs drive vibration of the angular velocity detection element or a detection circuit that detects detection vibration generated in the angular velocity detection element when an angular velocity is applied.

Application Example 8

An electronic apparatus according to this application example includes the vibrator element according to the application example.

With this configuration, it is possible to obtain an electronic apparatus with high reliability.

Application Example 9

A moving object according to this application example includes the vibrator element according to the application example.

With this configuration, it is possible to obtain a moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, detailed description will be made according to a method of adjusting an angular velocity detection element according to the invention.

First Embodiment

Figure 1:
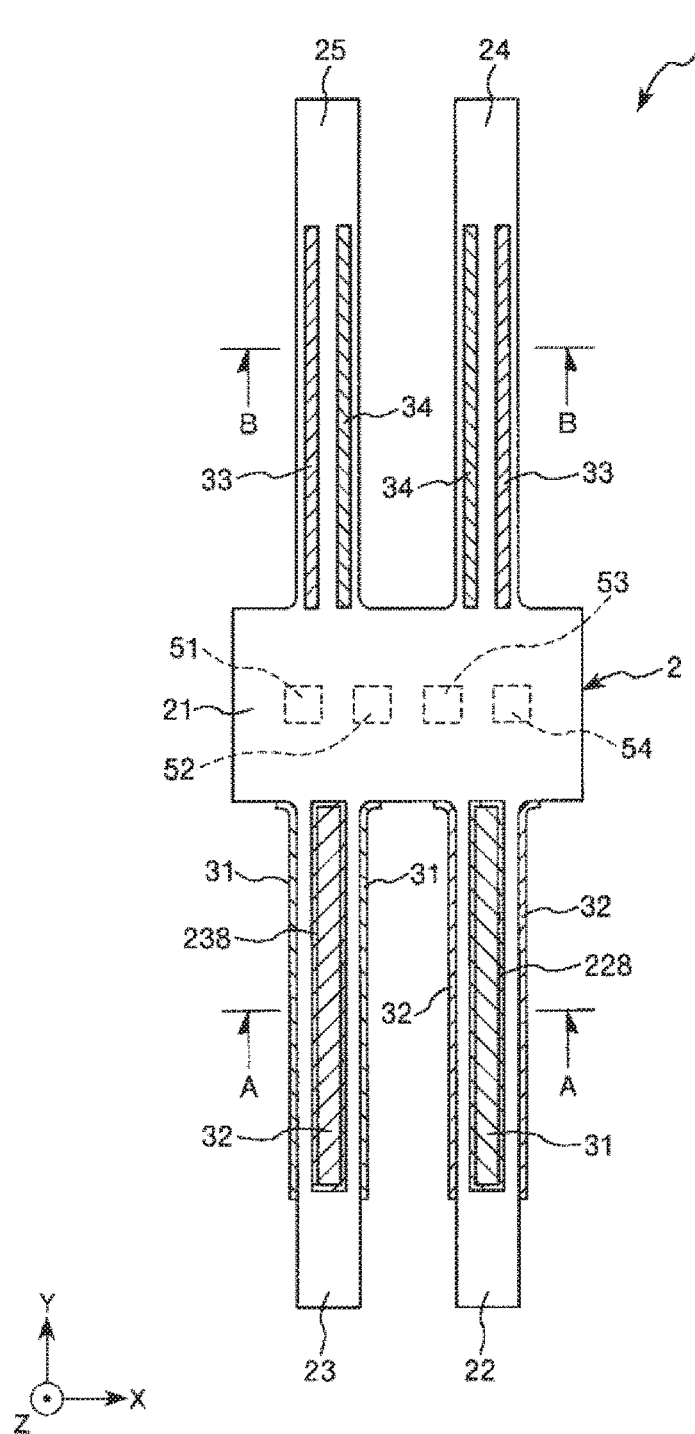
FIG. 1 is a plan view illustrating a vibrator element according to a first embodiment of the invention.
Figure 2A:
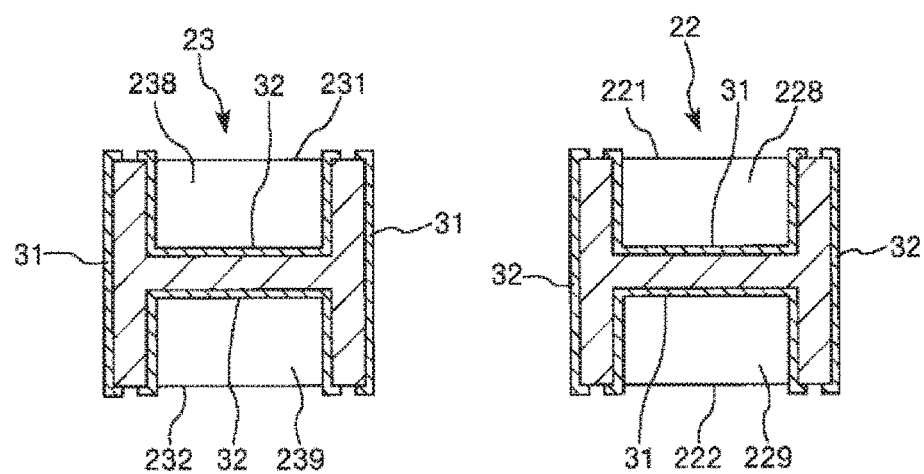
FIG. 2A is a sectional view taken along the line A-A of FIG. 1.
Figure 2B:
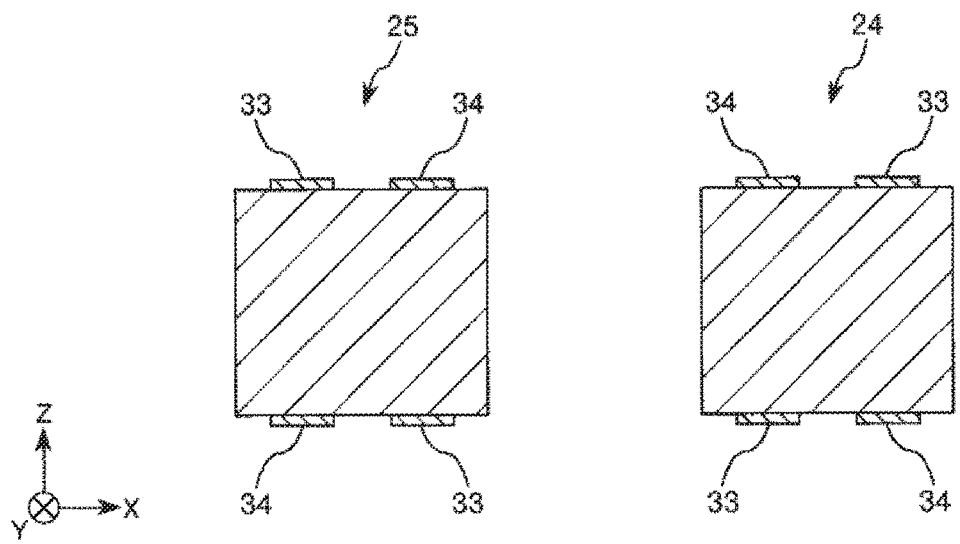
FIG. 2B is a sectional view taken along the line B-B of FIG. 1.
Figure 3B:
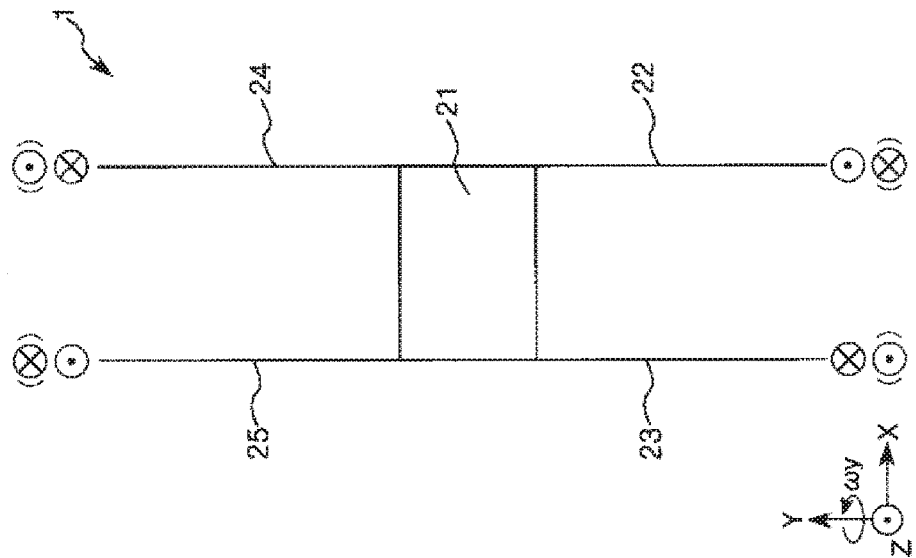
FIG. 3B is a schematic view illustrating a detection vibration mode.
Figure 3A:
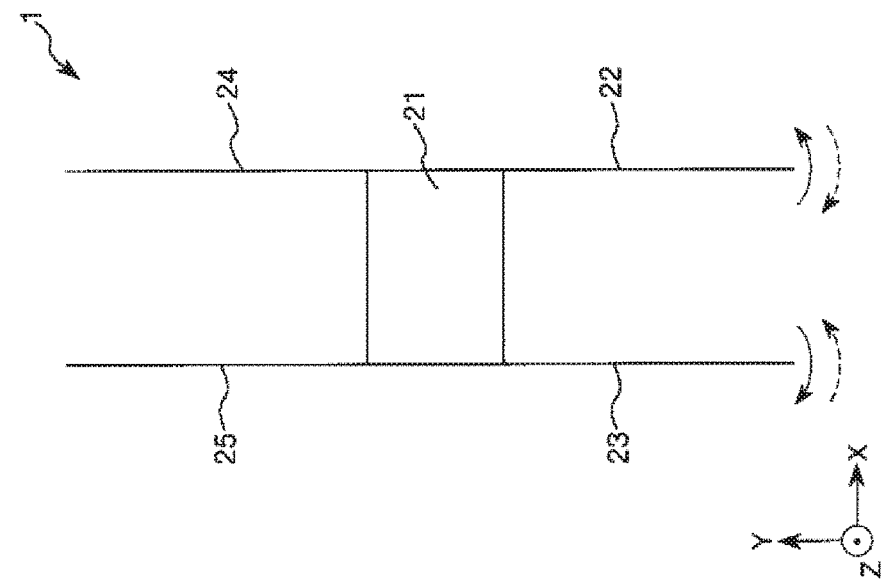
FIG. 3A is a schematic view illustrating a drive vibration mode.
Figure 4:
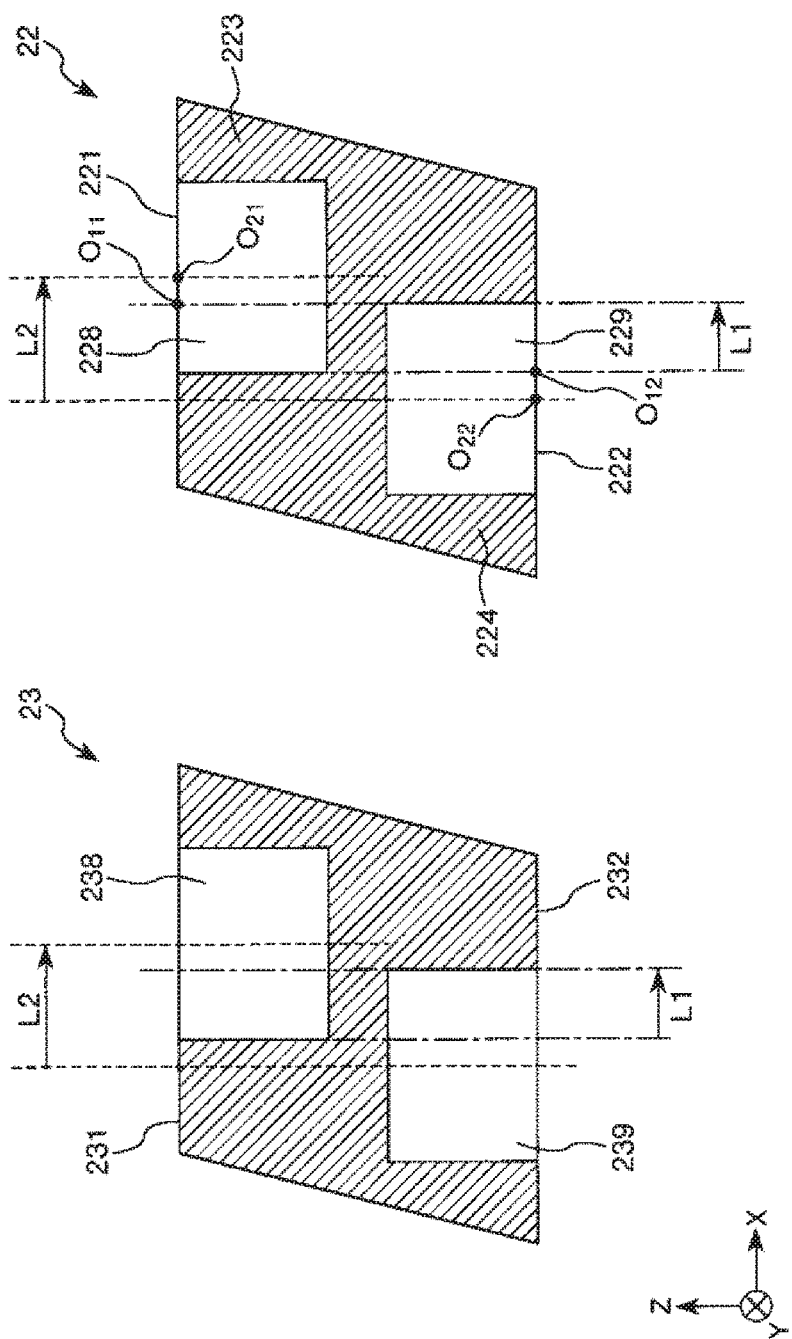
FIG. 4 is a sectional view illustrating a drive arm.
Figure 5A:
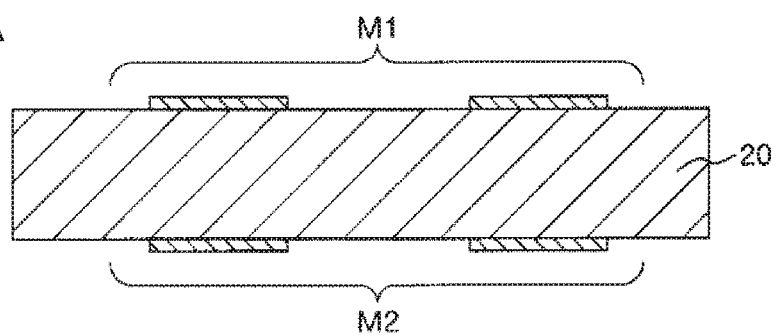
FIGS. 5A to 5C are diagrams illustrating a method of obtaining a quartz crystal substrate using a wet etching technology.
Figure 5B:
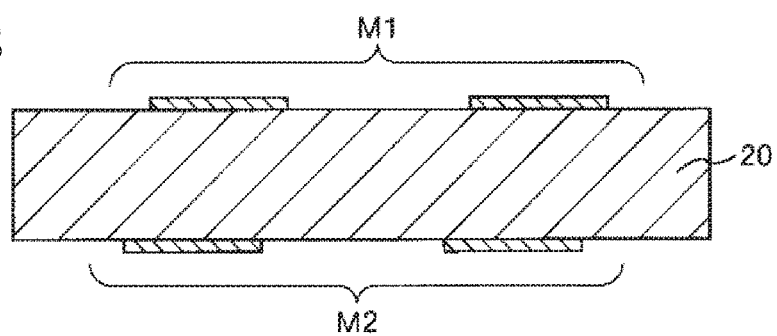
Figure 5C:
Figure 6A:
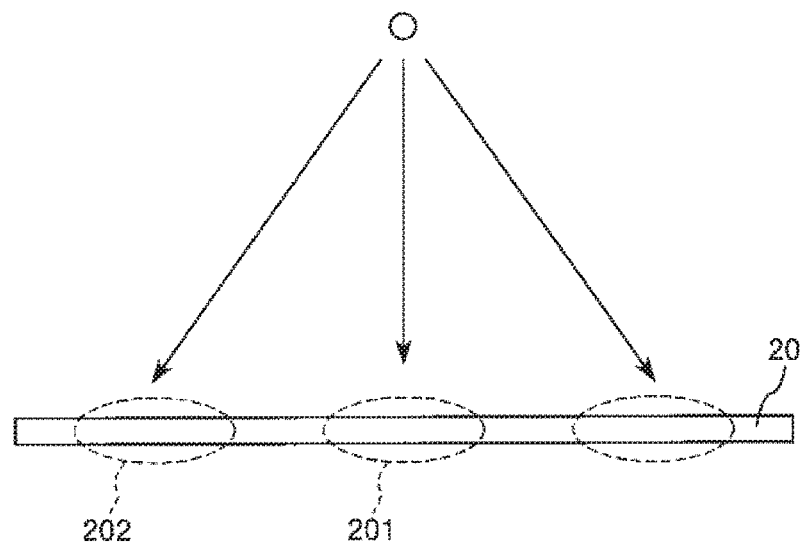
FIGS. 6A to 6C are diagrams illustrating a method of obtaining a quartz crystal substrate using a dry etching technology.
Figure 6B:
Figure 6C:
Figure 7:
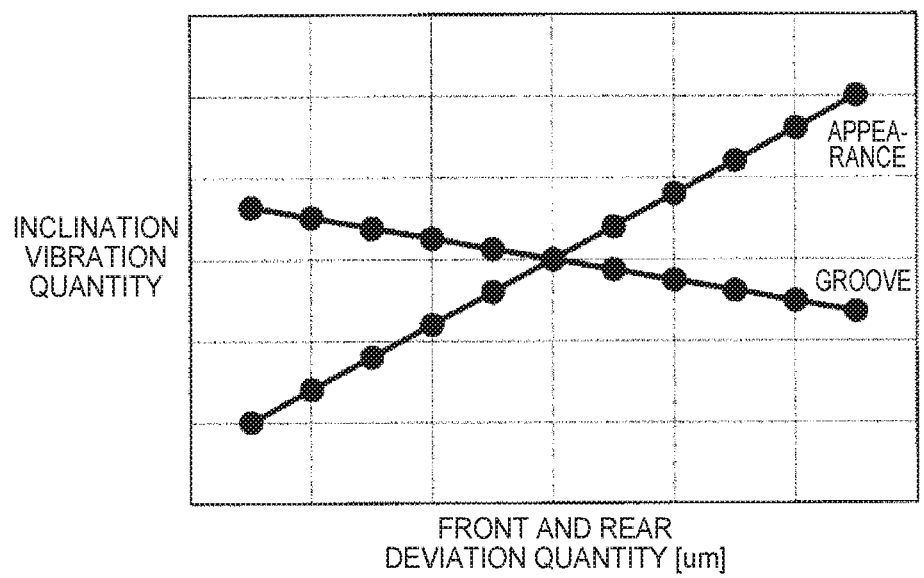
FIG. 7 is a graph illustrating a relation between a deviation quantity and a vibration quantity in the Z axis direction.

FIG. 1 is a plan view illustrating a vibrator element according to a first embodiment of the invention. FIG. 2A is a sectional view taken along the line A-A of FIG. 1. FIG. 2B is a sectional view taken along the line B-B of FIG. 1. FIG. 3A is a schematic view illustrating a drive vibration mode. FIG. 3B is a schematic view illustrating a detection vibration mode. FIG. 4 is a sectional view illustrating a drive arm. FIGS. 5A to 5C are diagrams illustrating a method of obtaining a quartz crystal substrate using a wet etching technology. FIGS. 6A to 6C are diagrams illustrating a method of obtaining a quartz crystal substrate using a dry etching technology. FIG. 7 is a graph illustrating a relation between a deviation quantity and a vibration quantity in the Z axis direction.

Hereinafter, as illustrated in FIG. 1, three axes perpendicular to each other are referred to as X, Y, and Z axes. To facilitate the description, the +Z axis side is also referred to as "upper" and the −Z axis side is also referred to as "lower". The sectional views of FIGS. 2A and 2B are sectional views schematically illustrating detection arms and drive arms and are slightly different from the actual shapes.

A gyro element (angular velocity detection element) 1 illustrated in FIG. 1 is a vibrator element that can detect an angular velocity $\omega y$ around the Y axis. The gyro element 1 includes a quartz crystal substrate 2, and various electrodes 31, 32, 33, and 34 and various terminals 51, 52, 53, and 54 formed on the surface of the quartz crystal substrate 2.

The quartz crystal substrate 2 may be substituted with, for example, a substrate (piezoelectric substrate) made of any of various piezoelectric materials such as lithium niobate ($LiNbO_3$), lithium tantalate ($LiTaO_3$), lead zirconate titanate (PZT), lithium tetraborate ($Li_2B_4O_7$), and langasite crystal ($La_3Ga_5SiO_{14}$) for use. Here, by using the quartz crystal substrate 2, it is possible to obtain the gyro element 1 having more excellent frequency temperature characteristics than when other piezoelectric substrates are used.

As illustrated in FIG. 1, the quartz crystal substrate 2 has an extension on an XY plane defined by the X axis (electric axis) and the Y axis (mechanical axis) which are crystal axes of quartz crystal and is formed in a flat shape having a thickness in the Z axis (optical axis) direction. That is, the quartz crystal substrate 2 is formed of a Z-cut quartz crystal plate. In the embodiment, the Z axis matches the thickness direction of the quartz crystal substrate 2, but the invention is not limited thereto. From the viewpoint that a frequency temperature change near the normal temperature is decreased, the Z axis may be inclined slightly (for example, less than about ±15°) with respect to the thickness direction of the quartz crystal substrate 2. The thickness of the quartz crystal substrate 2 is not particularly limited and can be set in the range of, for example, about 50 μm to about 250 μm.

As illustrated in FIG. 1, the quartz crystal substrate 2 is formed in a substantial "H" shape, The quartz crystal substrate 2 includes a base portion 21, a pair of drive arms (vibration arms) 22 and 23 that extend from an end of the base portion 21 on the −Y axis side to the −Y axis side, and a pair of detection arms (vibration arms) 24 and 25 that extend from an end of the base portion 21 on the +Y axis side to the +Y axis side.

The base portion 21 supports the drive arms 22 and 23 and the detection arms 24 and 25. The base portion 21 has an extension on the XY plane and is formed in the plate shape having a thickness in the Z axis direction. The gyro element 1 in the base portion 21 is fixed to an object (for example, a base 81 of a package 8 to be described below). The drive signal terminal 51, the drive grounding terminal 52, the detection signal terminal 53, and the detection grounding terminal 54 are installed on the lower surface of the base portion 21.

The one pair of drive arms 22 and 23 are installed in parallel in the X axis direction and extend from the base portion 21 to the −Y axis side. As illustrated in FIG. 2A, the drive arm 22 has a groove 228 opened to an upper surface 221 and a groove 229 opened to a lower surface 222 and has a substantial "H" cross-sectional shape. Similarly, the drive arm 23 has a groove 238 opened to an upper surface 231 and a groove 239 opened to a lower surface 232 and has a substantial "H" cross-sectional shape. By forming the grooves 228, 229, 238, and 239 in the drive arms 22 and 23 in this way, a thermoelastic loss is reduced and a Q value is increased, and thus more excellent vibration characteristics can be obtained.

As illustrated in FIG. 2A, a drive signal electrode 31 and a drive grounding electrode 32 are installed in the drive arms 22 and 23, respectively. The drive signal electrode 31 is disposed on both main surfaces (upper and lower surfaces) of the drive arm 22 and both side surfaces of the drive arm 23 and the drive grounding electrode 32 is disposed on both side surfaces of the drive arm 22 and both main surfaces (upper and lower surfaces) of the drive arm 23. The drive signal electrode 31 is connected to the drive signal terminal 51 via a wiring (not illustrated) and the drive grounding electrode 32 is connected to the drive grounding terminal 52 via a wiring (not illustrated).

The one pair of detection arms 24 and 25 are installed in parallel in the X axis direction and extend from the base portion 21 to the +Y axis side. As illustrated in FIG. 2B, a detection signal electrode 33 and a detection grounding electrode 34 are installed in parallel in the X axis direction on each of the main surfaces (the upper and lower surfaces) of the detection arms 24 and 25. The detection signal electrode 33 is connected to the detection signal terminal 53 via a wiring (not illustrated) and the detection grounding electrode 34 is connected to the detection grounding terminal 54 via a wiring (not illustrated).

The gyro element 1 with such a configuration detects an angular velocity ωy as follows.

By applying an alternating voltage with a predetermined frequency between the drive signal electrode 31 and the drive grounding electrode 32 via the drive signal terminal 51 and the drive grounding terminal 52, a drive vibration mode is excited. Then, as illustrated in FIG. 3A, the drive arms 22 and 23 perform flexural vibration with inverse phases in the X axis direction (first direction). In this state, when the angular velocity ωy around the Y axis is applied to the gyro element 1, a Coriolis force works. As illustrated in FIG. 3B, a detection vibration mode is newly excited, the drive arms 22 and 23 perform flexural vibration with inverse phases in the Z axis direction (second direction), and the detection arms 24 and 25 also perform flexural vibration with inverse phases in the Z axis direction in response to the flexural vibration. Then, by the flexural vibration of the detection arms 24 and 25, charges are generated between the detection signal electrode 33 and the detection grounding electrode 34. The charges are extracted as a detection signal from between the detection signal terminal 53 and the detection grounding terminal 54 and the angular velocity ωy is obtained based on the magnitude of the extracted detection signal.

The basic configuration of the gyro element 1 has been described in brief.

Next, the configurations of the drive arms 22 and 23 will be described in detail.

As illustrated in FIG. 4, the drive arm 22 includes an upper surface (first main surface) 221, a lower surface (second main surface) 222 having a front and rear relation with the upper surface 221, a groove (first groove) 228 opened to the upper surface 221, and a groove (second groove) 229 opened to the lower surface 222. The upper surface 221 is disposed to be deviated from the lower surface 222 on the +X axis side (one side), and thus the drive arm 22 has a substantially parallelogrammic cross-sectional shape.

Similarly, the drive arm 23 includes an upper surface (first main surface) 231, a lower surface (second main surface) 232 having a front and rear relation with the upper surface 231, a groove (first groove) 238 opened to the upper surface 231, and a groove (second groove) 239 opened to the lower surface 232. The upper surface 231 is disposed to be deviated from the lower surface 232 on the +X axis side (one side), and thus the drive arm 23 has a substantially parallelogrammic cross-sectional shape.

Here, there are mainly two reasons why the upper surfaces 221 and 231 are deviated from the lower surfaces 222 and 232 in the +X axis direction. The first reason is that the upper surfaces 221 and 231 are disposed to be shifted from the lower surfaces 222 and 232 in the +X axis direction from a design stage and the drive arms 22 and 23 are formed as the drive arms 22 and 23 are designed. The second reason is that the quartz crystal substrate 2 having a substantially rectangular cross-sectional shape so that the upper surfaces 221 and 231 and the lower surfaces 222 and 232 are not deviated is formed, but the upper surfaces 221 and 231 are deviated from the lower surfaces 222 and 232 due to manufacturing problems.

As the manufacturing problems, two main problems are considered. The first problem is, for example, deviation of upper and lower masks in a case in which the quartz crystal substrate 2 is manufactured from a quartz crystal wafer 20 by wet etching. That is, as illustrated in FIG. 5A, the upper and lower masks M1 and M2 originally have to be formed to match and overlap each other, but are formed to be deviated in the X axis direction due to limit or the like of manufacturing precision of the masks M1 and M2, as illustrated in FIG. 5B. When the quartz crystal wafer 20 is subjected to wet etching via the deviated masks M1 and M2, as illustrated in FIG. 5C, the drive arms 22 and 23 with a shape distorted in a substantial parallelogram are formed. The second problem is, for example, a location on a quartz crystal wafer in a case in which the quartz crystal substrate 2 is manufactured from the quartz crystal wafer 20 by dry etching. That is, depending on a dry etching apparatus, as illustrated in FIG. 6A, ion plasmas are accelerated radially to collide against the quartz crystal wafer 20. Therefore, as illustrated in FIG. 6B, the drive arms 22 and 23 with a substantially rectangular cross-sectional shape are formed in a middle portion 201 of the quartz crystal wafer 20. However, as illustrated in FIG. 6C, the drive arms 22 and 23 with a shape distorted in a substantial parallelogram are formed in a circumferential portion 202.

When the drive arms 22 and 23 are distorted in the parallelogrammic shape due to such reasons, vibration in the Z axis direction may be coupled with vibration of the drive arms 22 and 23 in the X axis direction at the time of driving of the gyro element 1 in the drive vibration mode. Then, the detection arms 24 and 25 may vibrate in the Z axis direction in response to the vibration of the drive arms 22 and 23 in the Z axis direction. That is, even when the angular velocity ωy is not applied, a detection signal (charges) is generated from the detection arms 24 and 25. Thus, an error of the angular velocity ωy may be detected or detection precision of the angular velocity ωy may deteriorate.

Accordingly, when the gyro element 1 is driven in the drive vibration mode, the positions of the grooves 228 and 229 in the drive arm 22 and the positions of the grooves 238 and 239 in the drive arm 23 have been contrived so that the drive arms 22 and 23 do not vibrate in the Z axis direction (so that the vibration in the Z axis direction is reduced). The detailed description will be made below. Since the drive arms 22 and 23 have the same configuration, the drive arm 22 will be described below as a representative. The description of the drive arm 23 will be omitted.

As illustrated in FIG. 4, in the drive arm 22, the groove 228 opened to the upper surface 221 is disposed to be deviated from the groove 229 opened to the lower surface 222 on the +X axis side (one side: the same side as the upper surface 221). When L1 is a deviation quantity of a width center $O_{11}$ of the upper surface 221 on the +X axis side from a width center (a center in the X axis direction: a point bisecting the width) $O_{12}$ of the lower surface 222 and L2 is a deviation quantity of a width center $O_{21}$ of the groove 228 on the +X axis side from a width center $O_{22}$ of the groove 229, a relation of L2/L1>0 is satisfied. Here, FIG. 7 is a graph illustrating a relation between the deviation quantities L1 and L2 and a vibration quantity (amplitude) in the Z axis direction. As understood from the graph, the larger the deviation quantity L1 is, the larger the vibration quantity in the Z axis direction is. In contrast, the larger the deviation quantity L2 is, the smaller the vibration quantity in the Z axis direction is. Therefore, by satisfying the relation of L2/L1>0, it is possible to reduce the vibration quantity of the drive arm 22 in the Z axis direction.

The relation between the deviation quantities L1 and L2 is not particularly limited as long as the relation of L2/L1>0 described above is satisfied. Further, a relation of L2/L1>2 is preferably satisfied. Accordingly, the above-described advantage is more remarkable. In this case, the groove 228 is disposed to be biased so that the width center $O_{21}$ is located further on the +X axis side than the width center $O_{11}$ of the upper surface 221. The groove 229 is disposed to be biased so that the width center $O_{22}$ is located further on the −X axis side than the width center $O_{12}$ of the lower surface 222. The upper limit of L2/L1 is not particularly limited. For example, a relation of L2/L1<4 is preferably satisfied. Such a range is a realistic upper limit. For example, the thickness of a wall 223 of the groove 228 on the +X axis side and the thickness of a wall 224 of the groove 229 on the −X axis side can be sufficiently ensured. Therefore, it is possible to obtain the above-described advantages while maintaining a mechanical strength of the drive arm 22.

Second Embodiment

Next, a second embodiment of the vibrator element according to the invention will be described.

Figure 8:
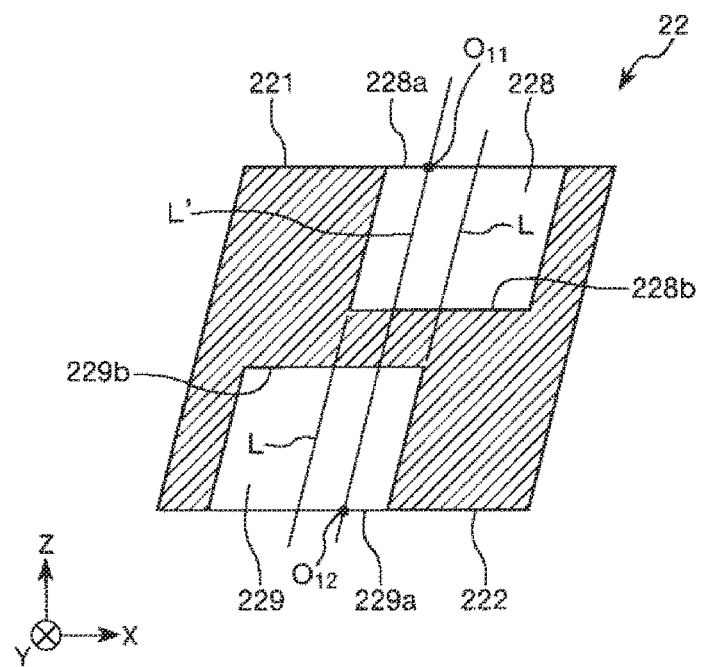
FIG. 8 is a sectional view illustrating a drive arm included in a vibrator element according to a second embodiment of the invention.

FIG. 8 is a sectional view illustrating a drive arm included in a vibrator element according to a second embodiment of the invention.

Hereinafter, differences between the vibrator element according to the second embodiment and the vibrator element according to the above-described first embodiment will be mainly described and the same matters will not be described.

The vibrator element according to the second embodiment of the invention is the same as that according to the above-described first embodiment except that the configuration of the grooves are different. The same reference numerals are given to the same configuration as the above-described first embodiment. In the embodiment, since the drive arms 22 and 23 have the same configuration, the drive arm 22 will be described below as a representative. The description of the drive arm 23 will be omitted.

In the drive arm 22 according to the embodiment, as illustrated in FIG. 8, the grooves 228 and 229 are each inclined to copy the inclination of the drive arm 22. That is, the groove 228 is disposed to be inclined with respect to the Z axis so that an opening 228a is deviated on the +X axis side from a bottom surface 228b. The groove 229 is disposed to be inclined with respect to the Z axis so that a bottom surface 229b is deviated on the +X axis side from an opening 229a. In this way, by forming the grooves 228 and 229 to be inclined, it is possible to reduce a vibration quantity of the drive arm 22 in the Z axis direction more efficiently.

A line segment L passing through a width center of the opening 228a (229a) and a width center of the bottom surface 228b (229b) is preferably substantially parallel to a line segment L' passing through a width center $O_{11}$ of the upper surface 221 and a width center $O_{12}$ of the lower surface 222. Accordingly, the above-described advantages are more remarkable.

In the second embodiment, it is also possible to obtain the same advantages as those of the above-described first embodiment.

Third Embodiment

Next, a third embodiment of the vibrator element according to the invention will be described.

Figure 9:
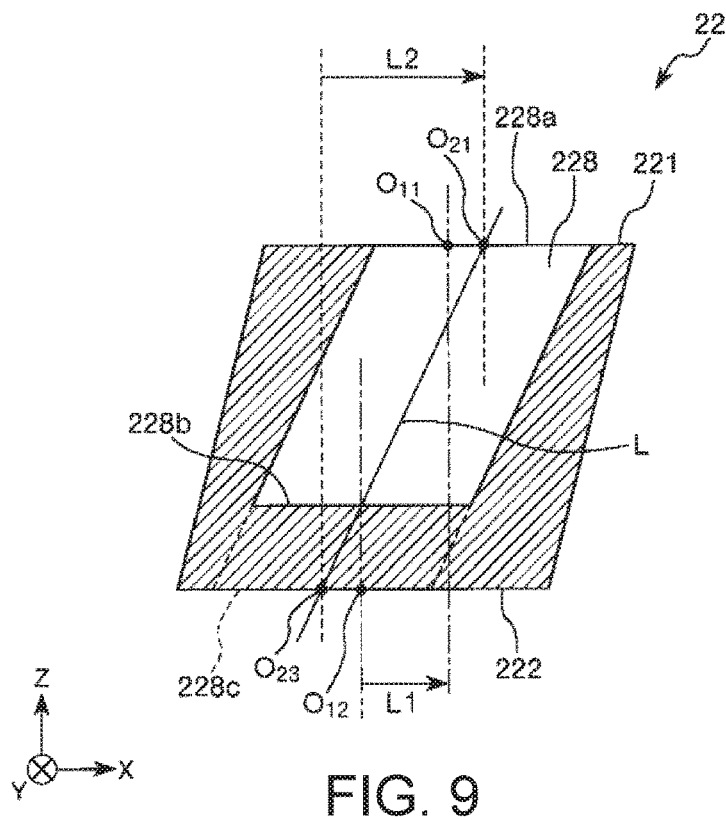
FIG. 9 is a sectional view illustrating a drive arm included in a vibrator element according to a third embodiment of the invention.

FIG. 9 is a sectional view illustrating a drive arm included in a vibrator element according to the third embodiment of the invention.

Hereinafter, differences between the vibrator element according to the third embodiment and the vibrator element according to the above-described first embodiment will be mainly described and the same matters will not be described.

The vibrator element according to the third embodiment of the invention is the same as that according to the above-described first embodiment except that the configuration of the grooves are different. The same reference numerals are given to the same configuration as the above-described first embodiment. In the embodiment, since the drive arms 22 and 23 have the same configuration, the drive arm 22 will be described below as a representative. The description of the drive arm 23 will be omitted.

In the gyro element 1 according to the embodiment, as illustrated in FIG. 9, the drive arm 22 to the groove 229 are omitted in the configuration. The drive arm 22 is inclined in the Z axis direction so that the upper surface 221 is deviated on the +X axis side from the lower surface 222. Similarly, the groove 228 is inclined in the Z axis direction so that opening 228a is deviated on the +X axis side from the bottom surface 228b. Here, a region intersecting the lower surface 222 by virtually extending the groove 228 in its depth direction (an extension direction of the line segment L passing through the width center of the opening 228a and the width center of the bottom surface 228b) is assumed to be a virtual opening 228c.

At this time, when L1 is a deviation quantity of the width center $O_{11}$ of the upper surface 221 on the +X axis side from the width center $O_{12}$ of the lower surface 222 and L2 is a deviation quantity of the width center $O_{21}$ of the opening 228a on the +X axis side from the width center $O_{23}$ of the virtual opening 228c, L1 and L2 satisfy a relation of L2/L1>0. By satisfying such a relation, it is possible to reduce the vibration quantity of the drive arm 22 in the Z axis direction by the same reasons as those of the above-described first embodiment.

The relation of the deviation quantities L1 and L2 is not particularly limited as long as the relation of L2/L1>0 is satisfied, as described above. A relation of L2/L1>2 is preferably satisfied. Accordingly, the above-described advantages are more remarkable. The upper limit of L2/L1 is not particularly limited. For example, a relation of L2/L1<4 is preferably satisfied. Such a range is a realistic upper limit. For example, the thickness of the wall 223 of the groove 228 on the +X axis side can be sufficiently ensured. Therefore, it is possible to obtain the above-described advantages while maintaining a mechanical strength of the drive arm 22.

In the third embodiment, it is also possible to obtain the same advantages as those of the above-described first embodiment.

Vibrator

Next, a vibrator 10 including the gyro element 1 above described will be described.

Figure 10A:
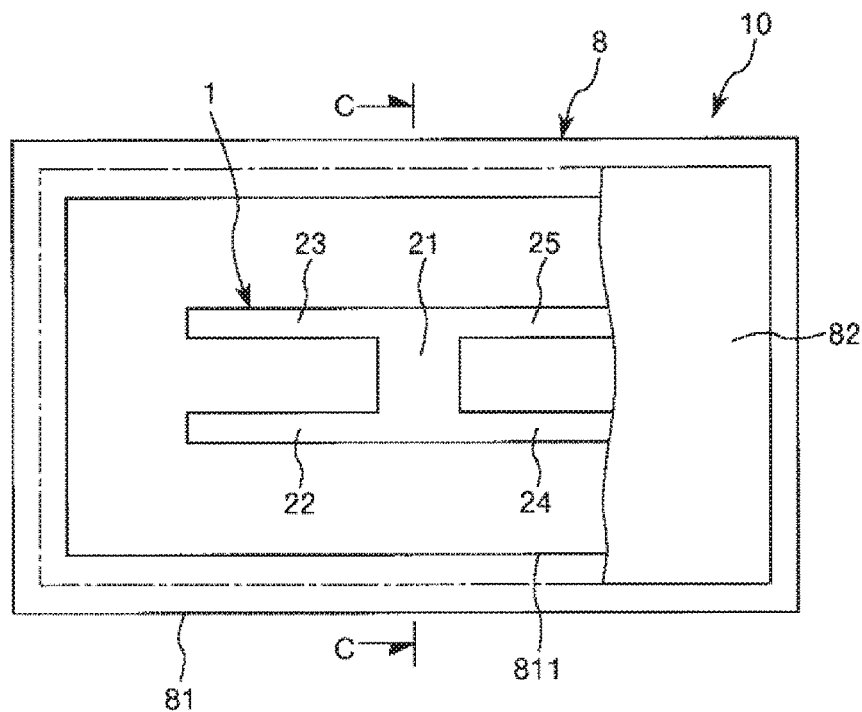
FIGS. 10A and 10B are sectional views illustrating a preferred embodiment of a vibrator according to the invention.
Figure 10B:
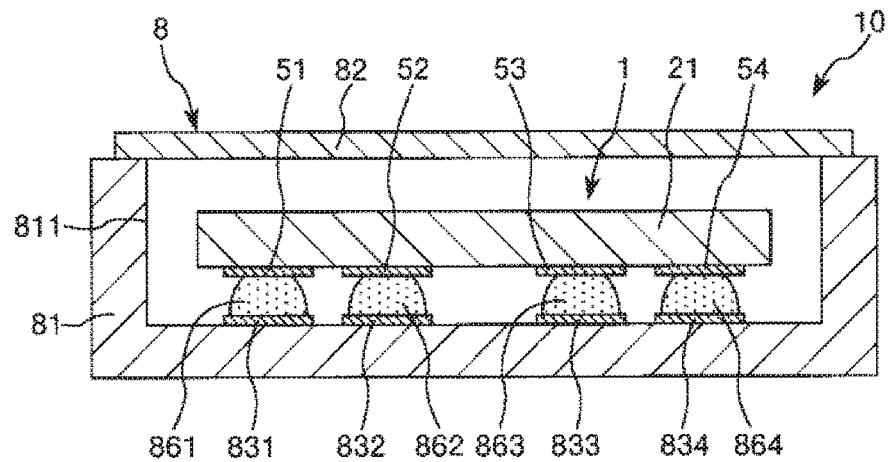

FIGS. 10A and 10B are sectional views illustrating a preferred embodiment of a vibrator according to the invention.

The vibrator 10 illustrated in FIGS. 10A and 10B includes the above-described gyro element 1 and a package 8 that accommodates the gyro element 1.

The package 8 includes a box-shaped base 81 that includes a concave portion 811 and a plate-shaped lid 82 that blocks an opening of the concave portion 811 and is joined to the base 81. The gyro element 1 is accommodated in an accommodation space formed in such a manner that the concave portion 811 is blocked by the lid 82. The accommodation space is in a depressurized (vacuum) state. Connection terminals 831, 832, 833, and 834 are formed on the bottom surface of the concave portion 811. The connection terminals 831 to 834 are drawn to the lower surface of the base 81 by internal wirings (not illustrated) formed in the base 81.

The gyro element 1 is fixed to the bottom surface of the concave portion 811 via conductive adhesives 861, 862, 863, and 864 in the base portion 21. The drive signal terminal 51 is electrically connected to the connection terminal 831 via the conducive adhesive 861, the drive grounding terminal 52 is electrically connected to the connection terminal 832 via the conductive adhesive 862, the detection signal terminal 53 is electrically connected to the connection terminal 833 via the conductive adhesive 863, and the detection grounding terminal 54 is electrically connected to the connection terminal 834 via the conductive adhesive 864. The conductive adhesives 861 to 864 are not particularly limited as long as the conductive adhesives have conductivity and adhesion. For example, an adhesive in which conductive fillers such as silver particles are dispersed in a silicon-based, epoxy-based, acrylic-based, polyimide-based, or bismaleimide-based adhesive can be used.

Gyro Sensor

Next, a gyro sensor including the gyro element 1 will be described.

Figure 11:
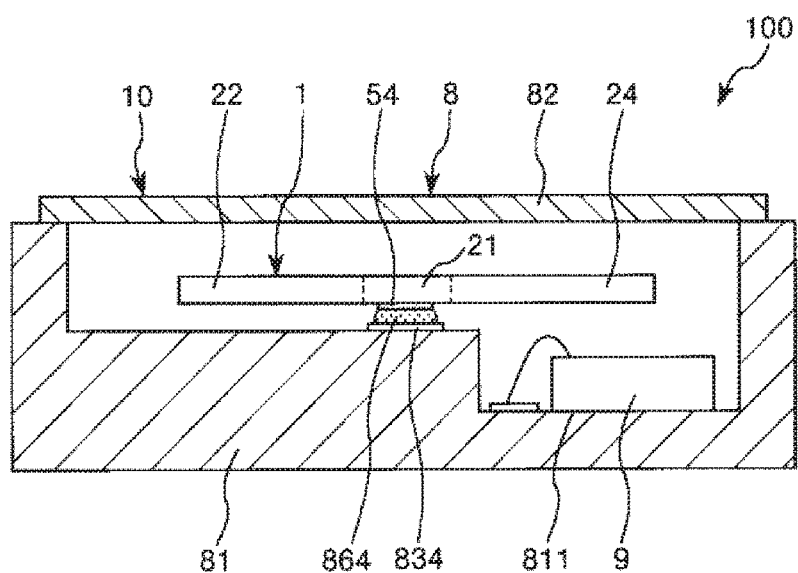
FIG. 11 is a sectional view illustrating a preferred embodiment of a gyro sensor.

FIG. 11 is a sectional view illustrating a preferred embodiment of a gyro sensor.

A gyro sensor 100 illustrated in FIG. 11 includes the vibrator 10 and an IC chip 9. The IC chip 9 is fixed to the bottom surface of the concave portion 811 by a brazing material or the like and is electrically connected to the gyro element 1. The IC chip 9 includes, for example, a drive circuit that performs drive vibration of the gyro element 1 or a detection circuit that detects detection vibration generated in the gyro element 1 when an angular velocity is applied.

In the embodiment, the IC chip 9 is installed inside the package 8, but the IC chip 9 may be installed outside of the package 8.

Electronic Apparatus

Next, an electronic apparatus including the gyro element 1 will be described.

Figure 12:
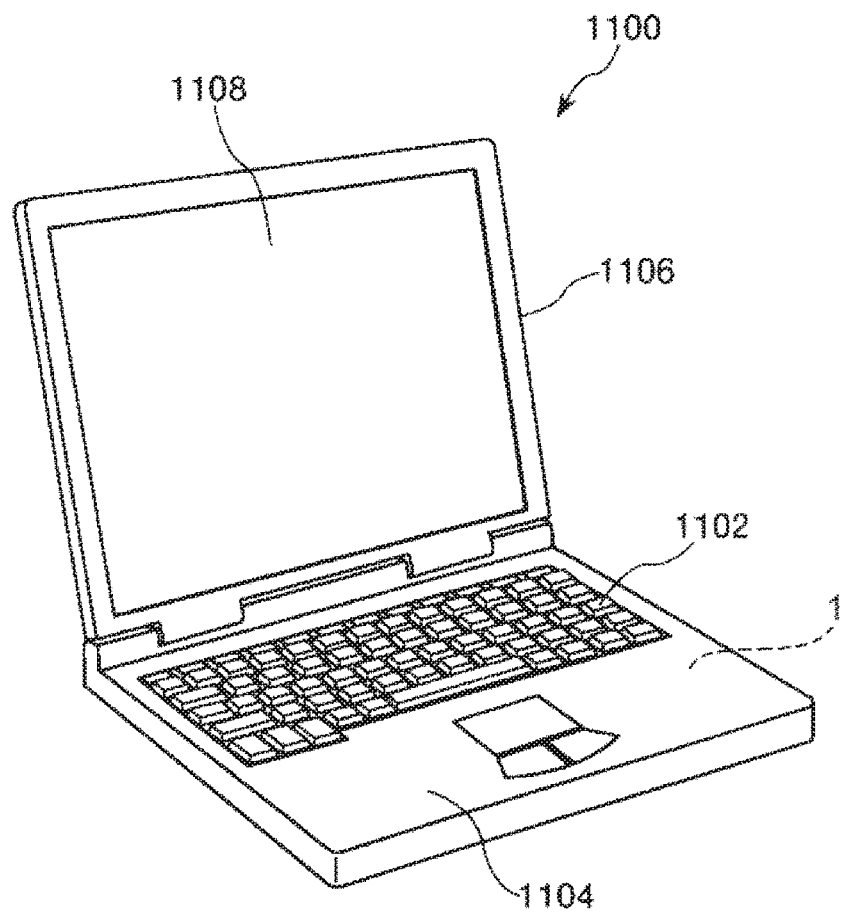
FIG. 12 is a perspective view illustrating the configuration of a mobile type (or notebook type) personal computer to which an electronic apparatus according to the invention is applied.

FIG. 12 is a perspective view illustrating the configuration of a mobile type (or notebook type) personal computer to which an electronic apparatus according to the invention is applied.

In FIG. 12, the personal computer 1100 is configured to include a body unit 1104 including a keyboard 1102 and a display unit 1106 including a display portion 1108. The display unit 1106 is supported to be rotated with a hinge structure unit interposed with the body unit 1104. In the personal computer 1100, the gyro element 1 functioning as an angular velocity detection unit (gyro sensor) is included.

Figure 13:
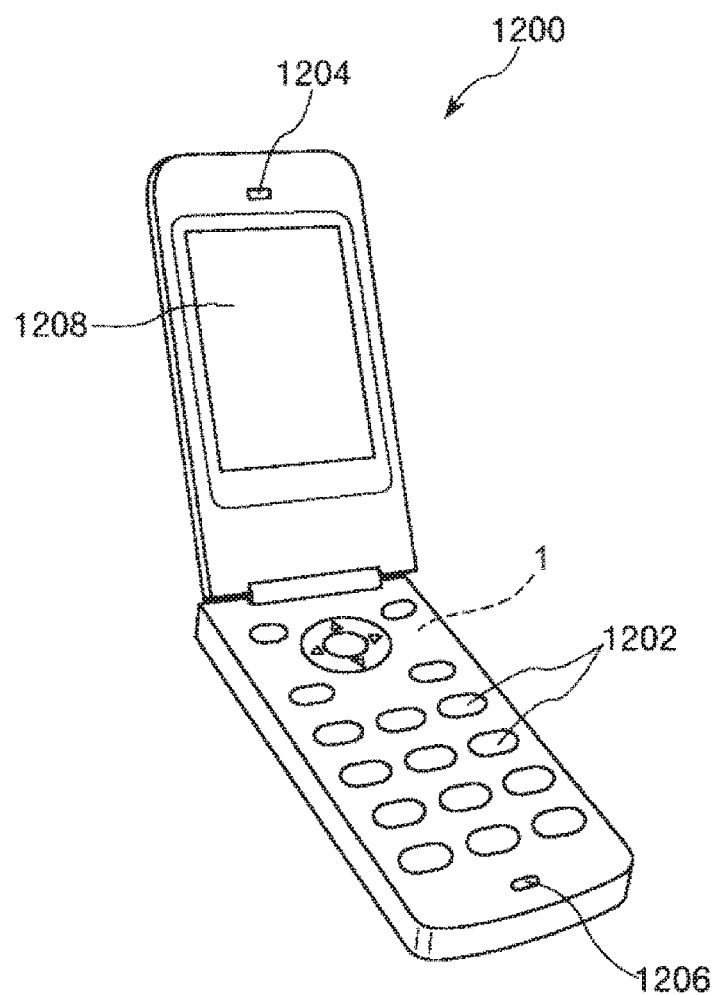
FIG. 13 is a perspective view illustrating the configuration of a mobile phone (including a smartphone or a PHS) to which an electronic apparatus according to the invention is applied.

FIG. 13 is a perspective view illustrating the configuration of a mobile phone (including a smartphone or a PHS) to which an electronic apparatus according to the invention is applied.

In FIG. 13, The mobile phone 1200 includes a plurality of operation buttons 1202, an earpiece 1204, and a mouthpiece 1206. A display unit 1208 is disposed between the operation buttons 1202 and the earpiece 1204. In the mobile phone 1200, the gyro element 1 functioning as an angular velocity detection unit (gyro sensor) is included.

Figure 14:
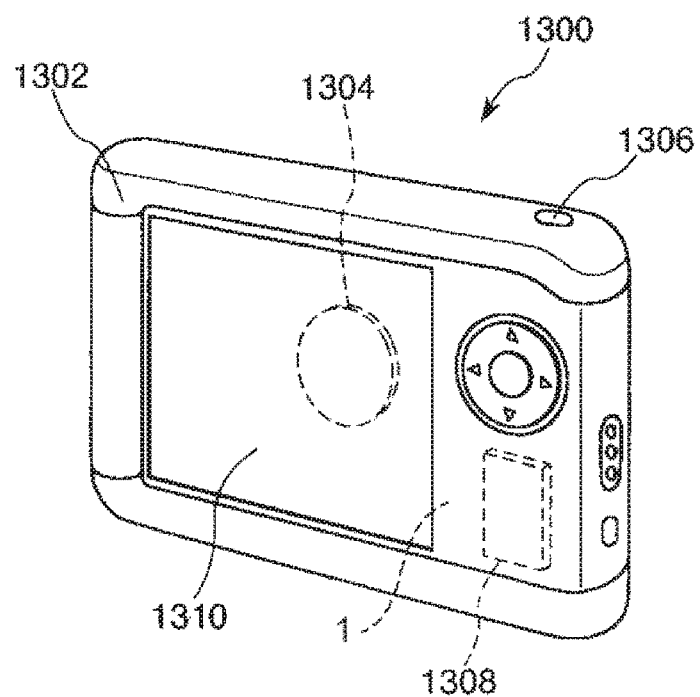
FIG. 14 is a perspective view illustrating the configuration of a digital still camera to which an electronic apparatus according to the invention is applied.

FIG. 14 is a perspective view illustrating the configuration of a digital still camera to which an electronic apparatus according to the invention is applied.

A display unit 1310 is installed on the rear surface of a case (body) 1302 of the digital still camera 1300 to perform display based on the imaging signal generated by the CCD. The display unit 1310 functions as a finder that displays a subject as an electronic image. A light-receiving unit 1304 including an optical lens (imaging optical system) or a CCD is installed on the front surface side (the rear surface side of the drawing) of the case 1302. When a photographer confirms a subject image displayed on the display unit 1310 and presses a shutter button 1306, an imaging signal of the CCD at that time is transmitted and stored in a memory 1308. In the digital still camera 1300, the gyro element 1 functioning as an angular velocity detection unit (gyro sensor) is included.

Since the foregoing electronic apparatus includes the gyro element 1, high reliability can be obtained.

The electronic apparatus according to the invention can be applied not only to the personal computer (mobile personal computer) in FIG. 12, the mobile phone in FIG. 13, and the digital still camera in FIG. 14, but can also be applied to, for example, a smartphone, a tablet terminal, a clock, an ink jet ejection apparatus (for example, an ink jet printer), a laptop personal computer, a television, a video camera, a video tape recorder, a car navigation apparatus, a pager, an electronic organizer (also including a communication function unit), an electronic dictionary, a calculator, an electronic game apparatus, a word processor, a workstation, a television phone, a security television monitor, electronic binoculars, a POS terminal, medical apparatuses (for example, an electronic thermometer, a blood pressure meter, a blood-sugar meter, an electrocardiographic apparatus, an ultrasonic diagnostic apparatus, and an electronic endoscope), a fish finder, various measurement apparatuses, meters (for example, meters for vehicles, airplanes, and ships), and a flight simulator.

Moving Object

Next, a moving object including the gyro element 1 illustrated in FIG. 1 will be described.

Figure 15:
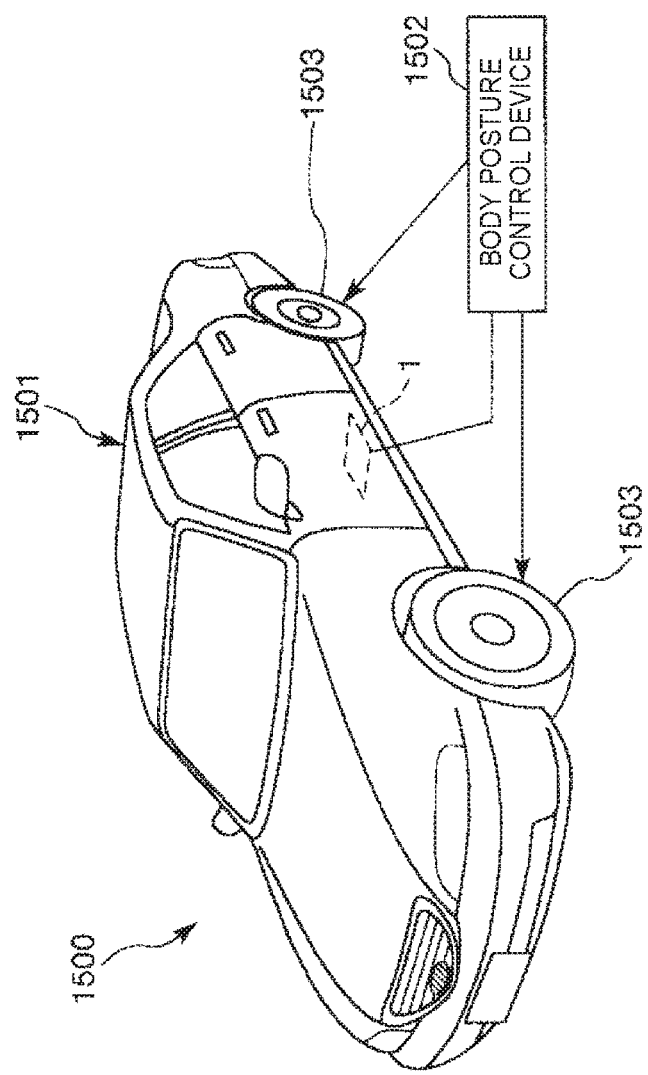
FIG. 15 is a perspective view illustrating the configuration of an automobile to which a moving object according to the invention is applied.

FIG. 15 is a perspective view illustrating the configuration of an automobile to which the moving object according to the invention is applied.

An automobile 1500 includes the gyro element 1 that functions as an angular velocity detection unit (gyro sensor). A posture of a body 1501 can be detected by the gyro element 1. A detection signal of the gyro element 1 is supplied to a body posture control device 1502. The body posture control device 1502 can detect a posture of the body 1501 based on the signal, and can control hardness and softness of a suspension according to a detection result or control of a brake of individual wheels 1503. In addition, the posture control can be used for a bipedal walking robot or a radio controlled helicopter. As described above, posture control of various moving objects is realized by embedding the gyro element 1.

The vibrator element, the vibrator, the electronic apparatus, and the moving object according to the invention have been described according to the illustrated embodiments, but the invention is not limited thereto. The configuration of each unit can be substituted with any configuration having the same function. Other any constituents may be added to the invention. The invention may be implemented by combining any two or more of the configurations (features) in the above-described embodiments.

The entire disclosure of Japanese Patent Application No. 2015-076035, filed Apr. 2, 2015 is expressly incorporated by reference herein.

What is claimed is:

1. A vibrator element comprising:
a base; and
a vibration arm that is connected to the base, the vibration arm being configured to perform flexural vibration in a first direction included in an in-plane direction of the base, the vibrating arm extending in a second direction perpendicular to the first direction, the vibration arm having:
a first main surface and a second main surface opposite to each other in a third direction perpendicular to the first and second directions, the first and second main surfaces extending along the first and second directions;
a first side surface and a second side surface opposite to each other in the first direction, the first side surface connecting between one side of the first main surface and one side of the second main surface, and the second side surface connecting between the other side of the first main surface and the other side of the second main surface, an entirety of the first and second side surfaces being first and second side planes that incline in the same direction with respect to the third direction;
a first groove provided in the first main surface, the first groove extending in the second direction, the first groove having a first opening at the first main surface; and
a second groove provided in the second main surface, the second groove extending in the second direction, the second groove having a second opening at the second main surface,
wherein the first main surface is deviated on one side of the first direction along the first direction with respect to the second main surface,
wherein the first groove is deviated on the one side of the first direction along the first direction with respect to the second groove, and
wherein when L1 is a deviation quantity along the first direction between a center of the first main surface and a center of the second main surface, and when L2 is a deviation quantity along the first direction between a center of the first opening and a center of the second opening, $L2/L1>0$.

2. The vibrator element according to claim 1,
wherein the first groove has a first bottom, and the center of the first opening is deviated on the one side of the first direction along the first direction with respect to a center of the first bottom, and
wherein the second groove has a second bottom, and a center of the second bottom is deviated on the one side of the first direction along the first direction with respect to the center of the second opening.

3. The vibrator element according to claim 1,
wherein a relation of $L2/L1>2$ is satisfied.

4. The vibrator element according to claim 1,
wherein a relation of $L2/L1<4$ is satisfied.

5. The vibrator element according to claim 1,
wherein the vibrator element is an angular velocity detection element that is configured to detect an angular velocity.

6. A gyro sensor comprising:
the angular velocity detection element according to claim 5;
a drive circuit that is configured to perform drive vibration of the angular velocity detection element; and
a detection circuit that is configured to detect detection vibration generated in the angular velocity detection element when an angular velocity is applied.

7. A vibrator comprising:
the vibrator element according to claim 2; and
a package that accommodates the vibrator element.

8. A vibrator comprising:
the vibrator element according to claim 3; and
a package that accommodates the vibrator element.

9. A vibrator comprising:
the vibrator element according to claim 4; and
a package that accommodates the vibrator element.

10. An electronic apparatus comprising:
the vibrator element according to claim 1;
a display that displays an image; and
a housing that houses the vibrator element and the display.

11. An electronic apparatus comprising:
the vibrator element according to claim 2;
a display that displays an image; and
a housing that houses the vibrator element and the display.

12. An electronic apparatus comprising:
the vibrator element according to claim 3;

a display that displays an image; and
a housing that houses the vibrator element and the display.

13. An electronic apparatus comprising:
the vibrator element according to claim 4;
a display that displays an image; and
a housing that houses the vibrator element and the display.

14. A moving object comprising:
the vibrator element according to claim 1; and
a movable body that houses the vibrator element.

15. A moving object comprising:
the vibrator element according to claim 2; and
a movable body that houses the vibrator element.

16. A moving object comprising:
the vibrator element according to claim 3; and
a movable body that houses the vibrator element.

\* \* \* \* \*